United States Patent
Schmid et al.

(10) Patent No.: US 9,799,801 B2
(45) Date of Patent: Oct. 24, 2017

(54) METHOD FOR PRODUCING AN OPTOELECTRONIC SEMICONDUCTOR CHIP

(71) Applicant: OSRAM Opto Semiconductors GmbH, Regensburg (DE)

(72) Inventors: Christian Schmid, Regensburg (DE); Julia Grosser, Regensburg (DE); Richard Floeter, Tegernheim (DE); Markus Broell, Freising (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/891,658

(22) PCT Filed: May 14, 2014

(86) PCT No.: PCT/EP2014/059840
§ 371 (c)(1),
(2) Date: Nov. 16, 2015

(87) PCT Pub. No.: WO2014/184240
PCT Pub. Date: Nov. 20, 2014

(65) Prior Publication Data
US 2016/0104819 A1    Apr. 14, 2016

(30) Foreign Application Priority Data
May 16, 2013 (DE) .................... 10 2013 105 035

(51) Int. Cl.
*G02B 6/42* (2006.01)
*H01L 33/44* (2010.01)
(Continued)

(52) U.S. Cl.
CPC .......... *H01L 33/44* (2013.01); *H01L 33/0079* (2013.01); *H01L 33/24* (2013.01);
(Continued)

(58) Field of Classification Search
CPC ........ H01L 27/288; H01L 25/167; G02B 6/42
See application file for complete search history.

(56) References Cited

U.S. PATENT DOCUMENTS 6,320,206 B1 * 11/2001 Coman .................. B82Y 20/00
257/103
2008/0038857 A1    2/2008 Kim et al.
(Continued)

FOREIGN PATENT DOCUMENTS

DE    102011015725 A1    10/2012
GB    2346479 A    8/2000
(Continued)

OTHER PUBLICATIONS

Ashby, C. et al.: "Origin of the time dependence of wet oxidation of AlGaAs", Applied Physics Letters, vol. 75, No. 1, Jul. 5, 1999, pp. 73-75.
(Continued)

*Primary Examiner* — Mohammad Choudhry
(74) *Attorney, Agent, or Firm* — McDermott Will & Emery LLP

(57) ABSTRACT

A method for producing an optoelectronic semiconductor chip comprises the following steps: providing a substrate, depositing a sacrificial layer, depositing a functional semiconductor layer sequence, laterally patterning the functional semiconductor layer sequence, and oxidizing the sacrificial layer in a wet thermal oxidation process.

17 Claims, 6 Drawing Sheets

(51) Int. Cl.
*H01L 33/00* (2010.01)
*H01L 33/24* (2010.01)

(52) U.S. Cl.
CPC .............. *H01L 2933/0025* (2013.01); *H01L 2933/0033* (2013.01)

(56) References Cited

U.S. PATENT DOCUMENTS

| | | |
|---|---|---|
| 2011/0159624 A1 | 6/2011 | Chen et al. |
| 2011/0198648 A1 | 8/2011 | Jung |
| 2012/0055532 A1 | 3/2012 | Wang et al. |

FOREIGN PATENT DOCUMENTS

| | | |
|---|---|---|
| JP | 2000228562 A | 8/2000 |
| JP | 2002228562 A | 8/2002 |
| JP | 2009094144 A | 4/2009 |
| JP | 2012195407 A | 10/2012 |
| JP | 2013004632 A | 1/2013 |
| WO | 2008/050901 A1 | 5/2008 |
| WO | 2009/044923 A1 | 4/2009 |
| WO | 2012/161451 A2 | 11/2012 |

OTHER PUBLICATIONS

Hobbs, L. et al.: "Reprocessing of Thermally Oxidized Aluminum Arsenide (AlAs) in Epitaxial Multilayers without Delamination", Journal of Electronic Materials, vol. 34, No. 3, 2005, pp. 232-239.
Tandon, S.N. et al.: "Large-Area Oxidation of AlAs Layers for Dielectric Stacks and Thick Buried Oxides", Journal of Electronic Materials, vol. 33, No. 7, 2004, pp. 774-779.

\* cited by examiner

METHOD FOR PRODUCING AN OPTOELECTRONIC SEMICONDUCTOR CHIP

A method is provided for producing an optoelectronic semiconductor chip.

One object consists in providing an improved method for producing an optoelectronic semiconductor chip.

To produce optoelectronic semiconductor chips it is possible to grow a semiconductor layer sequence epitaxially on a substrate. To produce "thin-film chips" it is moreover possible to bond the epitaxially grown semiconductor layer structure to a carrier after the epitaxial growth and remove the substrate. The substrate may for example be removed by thin-sectioning and subsequent wet chemical etching. However, the substrate is then lost and cannot be reused.

According to at least one embodiment of the method for producing an optoelectronic semiconductor chip, the method comprises steps of providing a substrate, depositing a sacrificial layer, depositing a functional semiconductor layer sequence, laterally patterning the functional semiconductor layer sequence and oxidizing the sacrificial layer in a wet thermal oxidation process. Advantageously, oxidation of the sacrificial layer makes it possible to detach the functional semiconductor layer sequence from the substrate. This advantageously allows separation of functional semiconductor layer sequence and substrate without having to this end to destroy the substrate. Through lateral patterning of the functional semiconductor layer sequence, oxidation of the sacrificial layer is advantageously simplified. Lateral patterning of the functional semiconductor layer sequence allows large-area, uniform oxidation of the sacrificial layer.

In a method described here, it is in particular possible for no etching to take place to separate functional semiconductor layer sequence and substrate. That is to say, the sacrificial layer is oxidized and not etched. In particular it is possible even beyond that for no etching to take place to separate functional semiconductor layer sequence and substrate. This makes it is possible for the substrate to be barely damaged or not damaged at all during separation. Detachment of the substrate may proceed purely mechanically, without use of any etching solution.

In one embodiment of the method, the sacrificial layer comprises AlAs. Advantageously, delamination may then arise in the region of the sacrificial layer during oxidation of said sacrificial layer, said delamination resulting in detachment of the functional semiconductor layer sequence from the substrate.

In one embodiment of the method, the sacrificial layer comprises $Al_xGa_{1-x}As$. In this case, the ratio of aluminum to gallium is greater than 80 to 20, preferably greater than 93 to 7. Advantageously, during oxidation of the sacrificial layer a porous layer may then form in the region of the sacrificial layer, which porous layer simplifies separation of the functional semiconductor layer sequence from the substrate.

In one embodiment, $AlO_xH_y$ is formed during oxidation of the sacrificial layer. Advantageously, the material formed during oxidation of the sacrificial layer may then be removed by means of an etching solution, in order to detach the functional semiconductor layer sequence from the substrate.

In one embodiment of the method, after oxidation of the sacrificial layer a further step is performed to separate the functional semiconductor layer sequence from the substrate. Advantageously, this enables subsequent reuse of the substrate, so meaning that the method may be performed inexpensively and resource-efficiently.

In one embodiment of the method, separation of the functional semiconductor layer sequence from the substrate comprises removal by means of an etching solution of an oxide formed during oxidation of the sacrificial layer. Advantageously, this allows simple and mechanically gentle detachment of the functional semiconductor layer sequence from the substrate.

In one embodiment of the method, an etching solution is used which comprises hydrofluoric acid. Advantageously, hydrofluoric acid has proven particularly effective in removing the oxidized sacrificial layer.

In one embodiment of the method, during separation of the functional semiconductor layer sequence from the substrate a shear force is exerted on the functional semiconductor layer sequence. Advantageously, this assists in separation of the functional semiconductor layer sequence from the substrate.

In one embodiment of the method, the substrate is then reused. Advantageously, the method may thereby be performed inexpensively and resource-efficiently.

In one embodiment of the method, the lateral patterning comprises the formation of trenches in the functional semiconductor layer sequence. Advantageously, the formation of trenches in the functional semiconductor layer sequence creates points of attack for oxidation of the sacrificial layer. In this case, an etching solution may for example penetrate through the trenches to the sacrificial layer. The lateral patterning ensures that the sacrificial layer is oxidized uniformly and reliably over its entire surface.

In one embodiment of the method, said method comprises a further step of bonding the functional semiconductor layer sequence to a carrier. Advantageously, the carrier may serve in mechanical stabilization of the functional semiconductor layer sequence after removal of the substrate. Moreover, electrical contacts for electrical contacting of the functional semiconductor layer sequence may be arranged on the carrier.

In one embodiment of the method, bonding of the functional semiconductor layer sequence to the carrier takes place prior to oxidation of the sacrificial layer. Advantageously, the semiconductor layer structure thereby displays high mechanical stability during oxidation. Moreover, during oxidation of the sacrificial layer different thermal expansions of the carrier and of the functional semiconductor layer sequence may cause compressive strain to build up, which assists in separation of the functional semiconductor layer sequence from the substrate.

In another embodiment of the method, bonding of the functional semiconductor layer sequence to the carrier takes place after oxidation of the sacrificial layer. Advantageously, after oxidation of the sacrificial layer an etchant may then penetrate particularly efficiently to the sacrificial layer.

In one embodiment of the method, the carrier comprises silicon or germanium. Advantageously, this allows inexpensive production of the carrier.

In one embodiment of the method, the substrate comprises GaAs. Advantageously, the functional semiconductor layer sequence may then be based for example on the material system InGaAlP.

The above-described characteristics, feature and advantages of this invention and the manner in which these are achieved will become clearer and more distinctly comprehensible from the present description of the exemplary embodiments, which are explained in greater detail in connection with the drawings. In the figures, in each case in schematic sectional representation:

Figure 1:
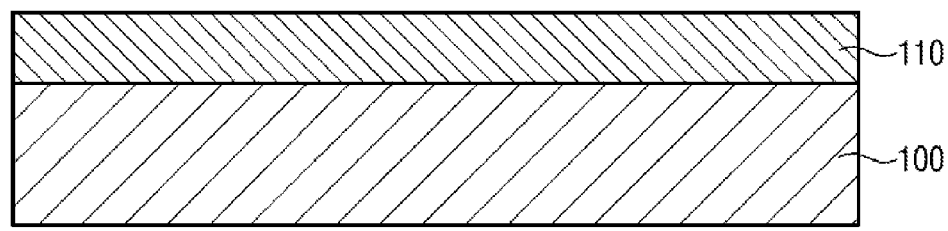
FIG. 1 shows a substrate with a buffer layer arranged thereon.

FIG. 1 shows a schematic sectional representation of a substrate 100. The substrate 100 may take the form, for example, of a semiconductor slice (wafer). The substrate 100 may comprise gallium arsenide (GaAs), for example.

A buffer layer 110 is arranged on a top of the substrate 100. The buffer layer 110 may for example comprise the same material as the substrate 100. The buffer layer 110 may have been deposited epitaxially on the top of the substrate 100.

Figure 2:
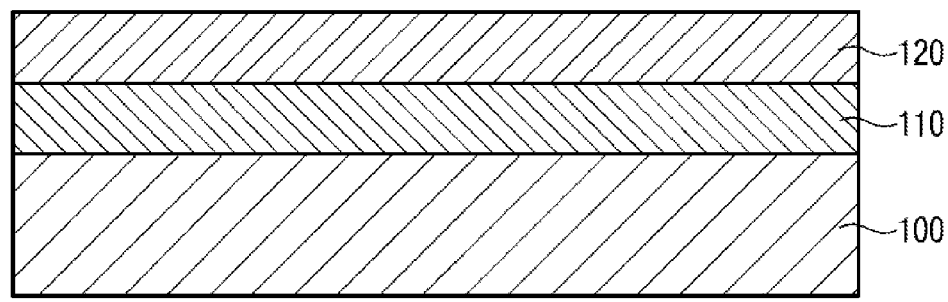
FIG. 2 shows the substrate with a sacrificial layer arranged on the buffer layer.

FIG. 2 shows a further schematic sectional representation of the substrate 100 in a processing state chronologically following the representation of FIG. 1. A sacrificial layer 120 has been arranged on a top of the buffer layer 110 remote from the substrate 100. The sacrificial layer 120 may have been applied by epitaxial growth, for example.

The sacrificial layer 120 comprises aluminum gallium arsenide ($Al_xGa_{1-x}As$). The content x of aluminum (Al) is here as high as possible relative to the content 1-x of gallium (Ga). The aluminum content x is preferably over 80%. Particularly preferably, the aluminum content x is over 93%. The sacrificial layer 120 may also comprise aluminum arsenide (AlAs) without any gallium content. The sacrificial layer 120 may have a thickness in the growth direction of for example between 30 nm and 300 nm. The sacrificial layer 120 may however also have a smaller or a greater thickness.

Figure 3:
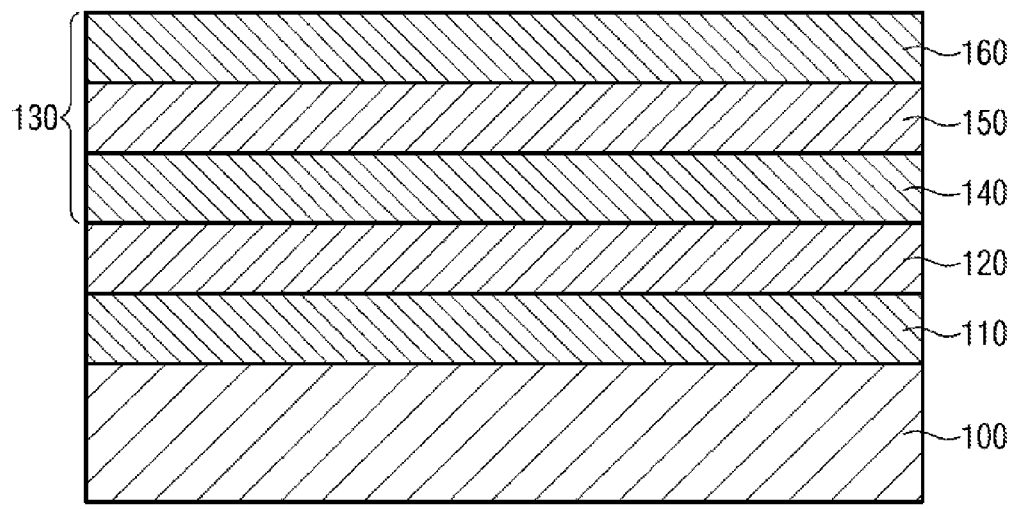
FIG. 3 shows the substrate with a functional semiconductor layer sequence deposited on the sacrificial layer.

FIG. 3 shows a further schematic sectional representation of the substrate 100 and of the layers arranged over the substrate 100 in a processing state chronologically following the representation of FIG. 2. A functional semiconductor layer sequence 130 has been applied over a top of the sacrificial layer 120 remote from the buffer layer 110. The functional semiconductor layer sequence 130 may have been applied by epitaxial growth, for example. The functional semiconductor layer sequence 130 may be based, for example, on the InGaAlP material system.

The functional semiconductor layer sequence 130 forms a light-emitting diode structure. The functional semiconductor layer sequence 130 comprises, in succession in the growth direction, a first doped layer 140, an active layer 150 and a second doped layer 160. The first doped layer 140 is either p-doped or n-doped. The second doped layer 160 comprises doping which is the reverse of the first doped layer 140, i.e. it is either n-doped or p-doped. The active layer 150 is provided for generating electromagnetic radiation and may for example comprise one or more quantum films.

Figure 4:
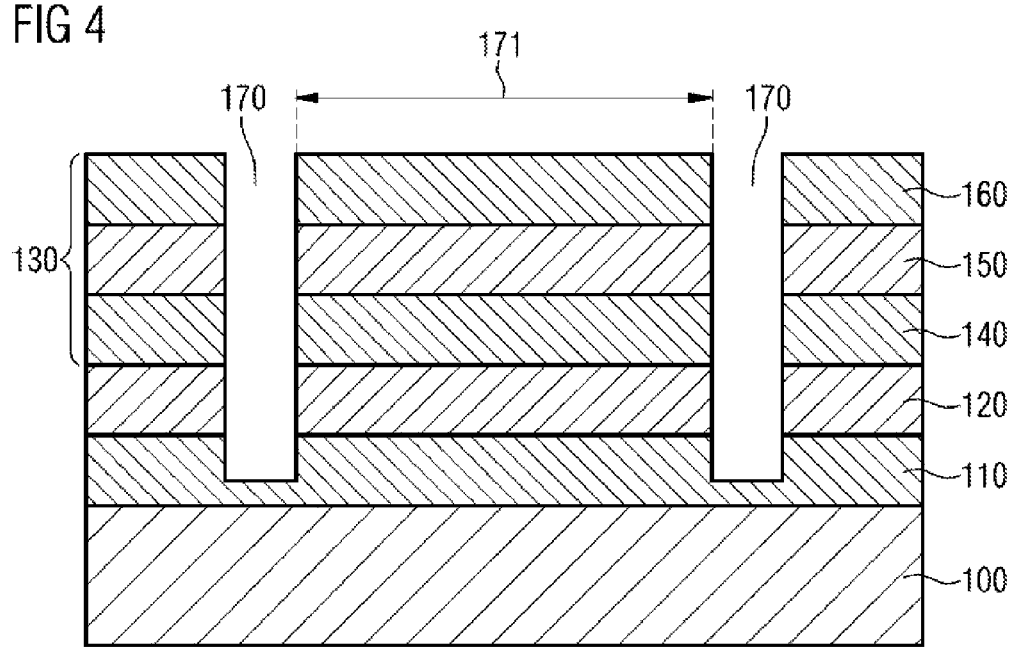
FIG. 4 shows the functional semiconductor layer sequence after lateral patterning.

FIG. 4 shows a further schematic sectional representation of the semiconductor layer structure arranged over the substrate 100 in a processing state chronologically following the representations of FIG. 3. The semiconductor layer structure has been patterned laterally in a mesa etching process. This has resulted in the formation of a grid-like system of trenches 170. The trenches 170 extend through the semiconductor layer structure in the opposite direction to the growth direction from a top of the functional semiconductor layer sequence 130 remote from the substrate 100. In the process, the trenches 170 split the functional semiconductor layer sequence 130 and the sacrificial layer 120 and end in the buffer layer 110, which acts as an etch stop layer. The trenches 170 may have been formed for example by an anisotropic dry etching process, for instance an ion etching process.

The system of trenches 170 subdivides the semiconductor layer structure in the lateral direction into individual lateral portions preferably rectangular or square in shape. A semiconductor chip is formed in each case from each of these lateral portions in a subsequent processing step.

The lateral portions of the semiconductor layer structure arranged between adjacent trenches 170 have a characteristic chip size 171 in the lateral direction. The chip size 171 may amount for example to 300 μm×300 μm.

Figure 5:
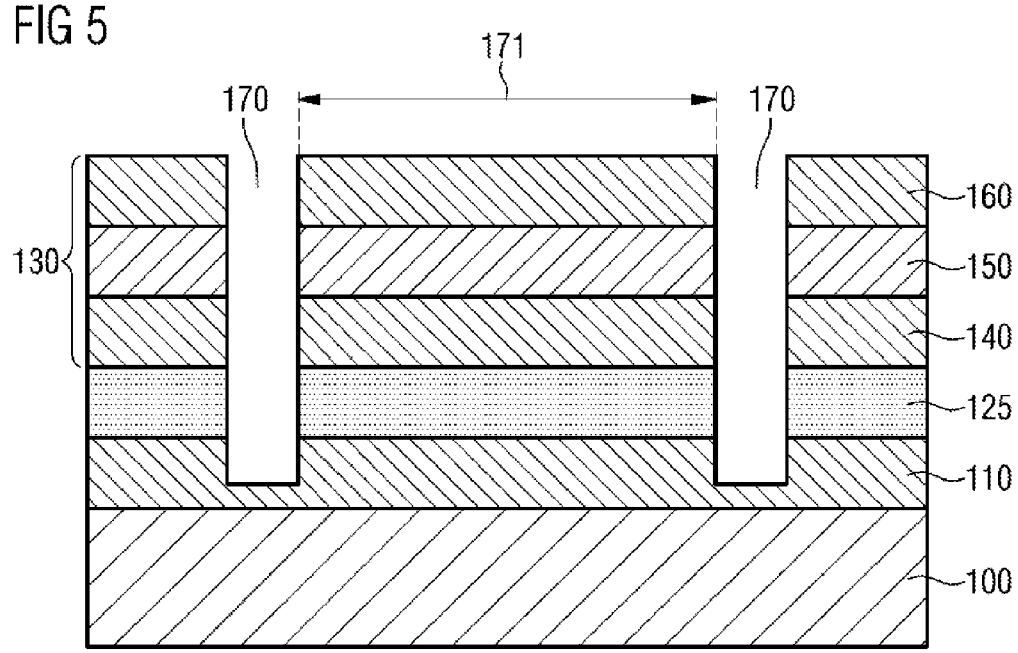
FIG. 5 shows the substrate with the functional semiconductor layer sequence after oxidation of the sacrificial layer.

FIG. 5 shows the semiconductor layer structure formed over the substrate 100 in a further schematic sectional representation in a processing state chronologically following the representation of FIG. 4. The sacrificial layer 120 has been oxidized in a wet thermal oxidation process to yield an oxidized sacrificial layer 125.

The wet thermal oxidation process may be performed for example at a temperature of between 300° C. and 500° C. The wet thermal oxidation process is preferably performed at a temperature of between 350° C. and 480° C.

During the wet thermal oxidation process a wet oxidation medium is conveyed past the semiconductor layer structure arranged over the substrate 100. The wet oxidation medium may for example have a flow rate of 6 ml/min of water ($H_2O$) supplied via an evaporator and a flow rate of four sl/min of nitrogen ($N_2$).

The oxidation medium may penetrate through the trenches 170 to the sacrificial layer 120 and oxidize the latter to yield the oxidized sacrificial layer 125. The trenches 170 opened towards the top of the semiconductor layer structure allow unhindered in- and outflow of the wet oxidation medium, so achieving a high oxidation rate and a short required oxidation period. As a result of the regular grid of trenches 170 in the lateral direction of the semiconductor layer structure, uniform oxidation of the sacrificial layer 120 over the entire lateral region of the semiconductor layer structure arranged over the substrate 100 is ensured.

Figure 6:
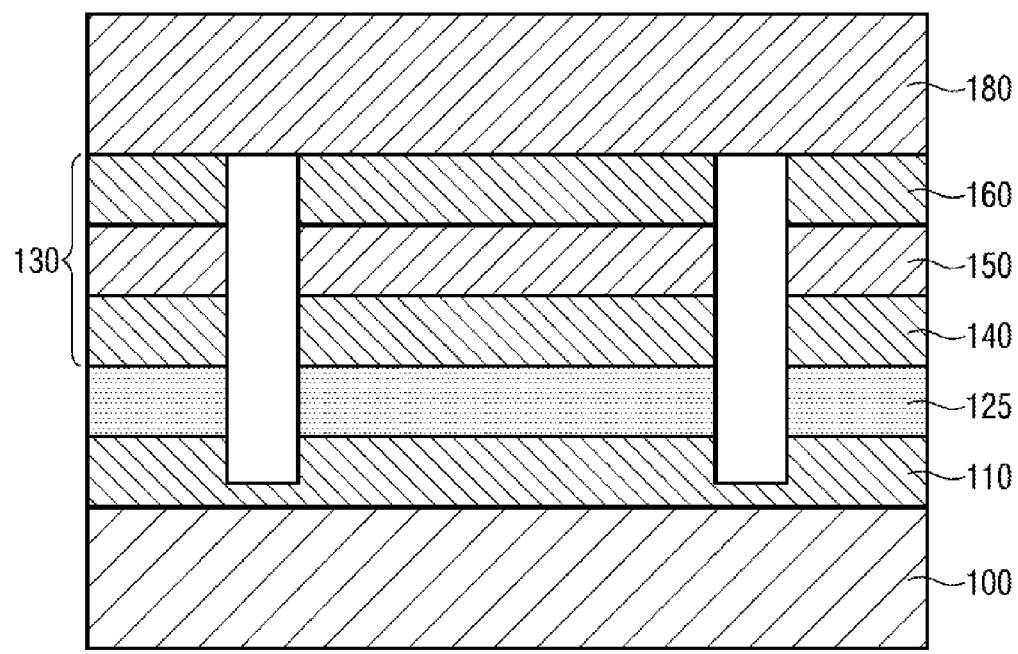
FIG. 6 shows the substrate with the functional semiconductor layer sequence with a carrier bonded to the functional semiconductor layer sequence.

FIG. 6 shows a further schematic sectional representation of the semiconductor layer structure formed over the substrate 100 in a processing state chronologically following the representation of FIG. 5. A top of the functional semiconductor layer sequence 130 remote from the substrate 100 has been bonded to a carrier 180. The carrier 180 may for example comprise silicon or germanium. The carrier 180 may for example take the form of a wafer.

Figure 7:
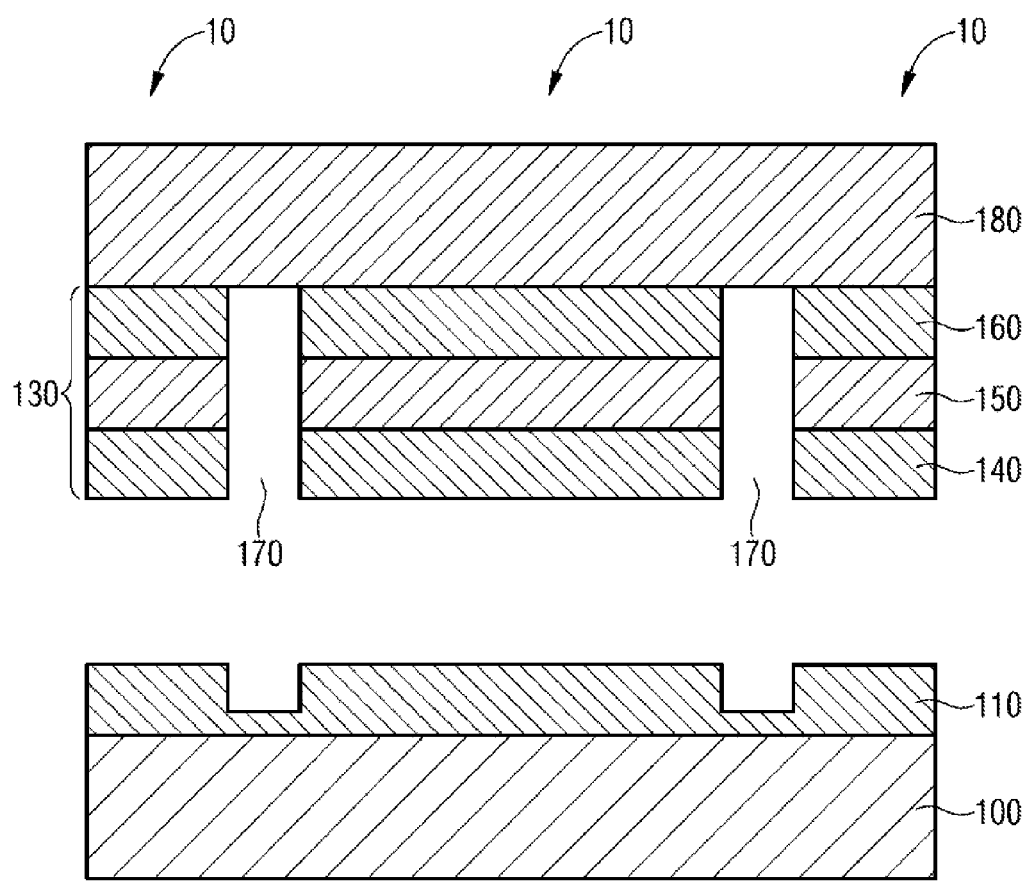
FIG. 7 shows the functional semiconductor layer sequence after detachment from the substrate.

FIG. 7 is a further schematic sectional representation of the substrate 100 and the functional semiconductor layer sequence 130 joined to the carrier 180, in a processing state chronologically following the representation of FIG. 6. The functional semiconductor layer sequence 130 has been detached from the substrate 100. The functional semiconductor layer sequence 130 and the substrate 110 have been separated from one another in the region of the oxidized sacrificial layer 125.

If the sacrificial layer 120 comprised aluminum gallium arsenide (AlGaAs), porous aluminum hydroxide ($AlO_xH_y$) may have been formed during oxidation of the sacrificial layer 120 to yield the oxidized sacrificial layer 125. Then the oxidized sacrificial layer 125 may have been removed by means of an etching solution, for example an etching solution with hydrofluoric acid (HF). In this way, the functional semiconductor layer sequence 130 was detached from the buffer layer 110 and the substrate 100. To assist in detachment of the functional semiconductor layer sequence 130 from the substrate 100, it is additionally possible for a shear force to have been exerted on the functional semiconductor layer sequence 130.

If the sacrificial layer 120 comprised aluminum arsenide (AlAs) without gallium content, delamination of the functional semiconductor layer sequence 130 from the buffer layer 120 and the substrate 100 may have arisen directly during oxidation of the sacrificial layer 120 to yield the oxidized sacrificial layer 125. This delamination may in turn have been assisted by the exertion of a shear force on the functional semiconductor layer sequence 130 relative to the substrate 100.

After detachment of the functional semiconductor layer sequence 130, the substrate 100 may be cleaned, rinsed and then reused to perform the production method explained with reference to FIGS. 1 to 7. This advantageously leads to a cost saving when performing the method.

By splitting the carrier 180 joined to the functional semiconductor layer sequence 130 along the trenches 170 arranged in the functional semiconductor layer sequence 130 and through further processing steps, a plurality of optoelectronic semiconductor chips 10 may be produced from the functional semiconductor layer sequence 130 and the carrier 180. The optoelectronic semiconductor chips 10 may for example be light-emitting diode chips (LED chips).

Figure 8:
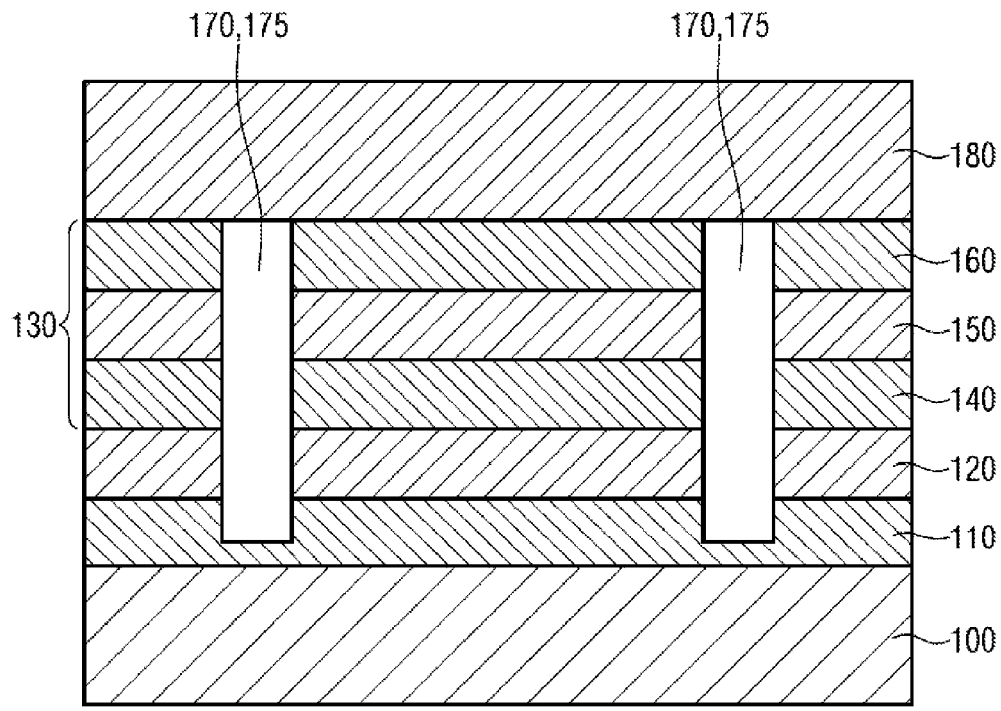
FIG. 8 shows the functional semiconductor layer sequence after lateral patterning with a carrier bonded to the functional semiconductor layer sequence.

FIG. 8 shows a schematic sectional representation of the substrate 100 and of the semiconductor layer structure formed over the substrate 100 in a processing state chronologically following the representation of FIG. 4 in the case of a procedure according to a variant of the production method explained above. The processing steps explained with reference to FIGS. 1 to 4 are performed identically in this variant. Elements of the semiconductor layer structure which correspond to elements in the representations of FIGS. 1 to 7 are provided in the figures explained below with the same reference signs as in the figures discussed above.

Starting from the processing state of FIG. 4, the top of the functional semiconductor layer sequence 130 remote from the substrate 100 was joined to the carrier 180 by a bonding process. The trenches 170 previously formed in the functional semiconductor layer sequence 130 and the sacrificial layer 120 then form channels 175, which are open in the lateral direction towards the side edge of the semiconductor layer structure, but at the top and bottom are delimited by the carrier 180 and the substrate 100 or the buffer layer 110.

Figure 9:
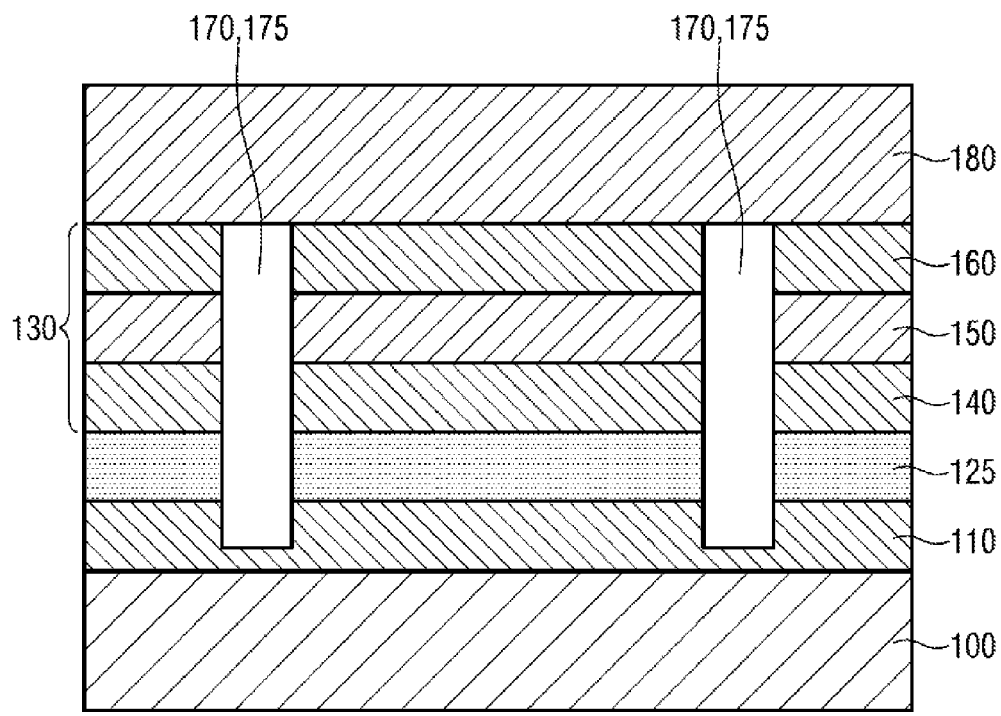
FIG. 9 shows the functional semiconductor layer sequence with the carrier after oxidation of the sacrificial layer.

FIG. 9 shows a further schematic sectional representation of the semiconductor layer structure with the substrate 100 and the carrier 180 in a processing state chronologically following the representation of FIG. 8. By means of a wet thermal oxidation process, the sacrificial layer 120 was oxidized to yield an oxidized sacrificial layer 125. Oxidation of the sacrificial layer 120 may proceed as described with reference to FIG. 5. During oxidation of the sacrificial layer 120, the oxidation medium used therefor flowed through the channels 175 in the semiconductor layer structure and was thereby able to attack the sacrificial layer 120 and oxidize it to yield the oxidized sacrificial layer 125.

Figure 10:
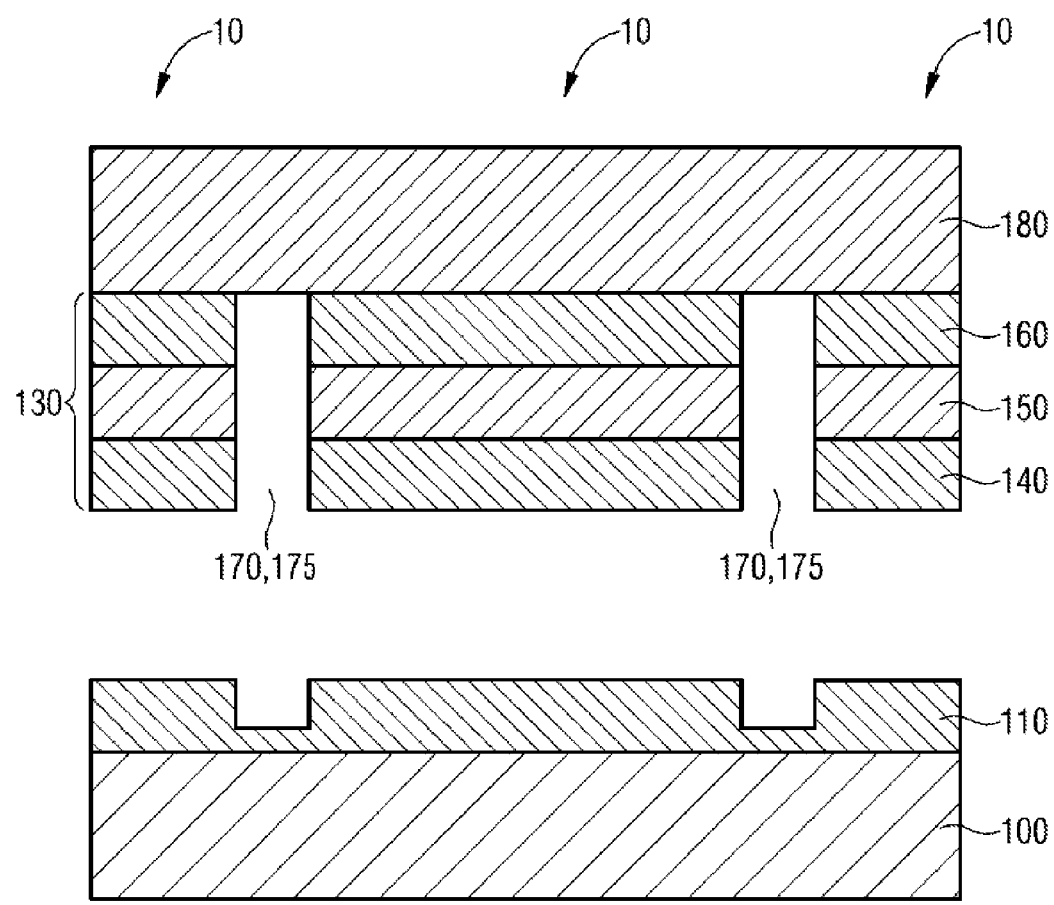
FIG. 10 shows the functional semiconductor layer sequence after detachment from the substrate.

FIG. 10 shows a further schematic sectional representation of the carrier 180 with the functional semiconductor layer sequence 130 and the substrate 100 in a processing state chronologically following the representation of FIG. 9. The functional semiconductor layer sequence 130 was detached from the substrate 100 and the buffer layer 110 arranged on the substrate 100.

Detachment of the functional semiconductor layer sequence 130 from the substrate 100 and the buffer layer 110 has taken place in the region of the oxidized sacrificial layer 125 and may, as described with reference to FIG. 7, have taken place with the exertion of a shear force on the functional semiconductor layer sequence 130 relative to the substrate 100 and/or through removal of the oxidized sacrificial layer 125 by means of an etching solution.

If the carrier 180 comprises silicon, during oxidation of the sacrificial layer 120 to yield the oxidized sacrificial layer 125 compressive strain may have built up in the functional semiconductor layer sequence 130 due to different coefficients of thermal expansion. In this way, during oxidation of the sacrificial layer 120 to yield the oxidized sacrificial layer 125 compressive stress may have built up in the region of the oxidized sacrificial layer 125, which assists in detachment of the functional semiconductor layer sequence 130 from the substrate 100 in the region of the oxidized sacrificial layer 125.

In subsequent further processing steps a plurality of optoelectronic semiconductor chips 10 may be produced from the functional semiconductor layer sequence 130 and the carrier 180. The substrate 100 may be reused for further performance of the described method.

The semiconductor layer structure of the optoelectronic semiconductor chips 10 produced according to the described method may comprise further layers in addition to the layers shown in the schematic figures. In particular, further layers may also be provided between the substrate 100 and the buffer layer 110, between the buffer layer 110 and the sacrificial layer 120, between the sacrificial layer 120 and the functional semiconductor layer sequence 130 and above the functional semiconductor layer sequence 130. The functional semiconductor layer sequence 130 may comprise more layers than the layers 140, 150, 160 shown.

For example, a marker layer may be provided between the sacrificial layer 120 and the functional semiconductor layer sequence 130. The marker layer may for example comprise GaAs. During the mesa etching process used to produce the trenches 170 (FIG. 4), the marker layer may serve as an indicator which indicates that the sacrificial layer 120 and thus the necessary etching depth will imminently be reached.

The invention has been illustrated and described in greater detail with reference to the preferred exemplary embodiments. The invention is nevertheless not restricted to the disclosed examples. Rather, other variations may be derived therefrom by a person skilled in the art without going beyond the scope of protection of the invention.

This patent application claims priority from German patent application 102013105035.2, the disclosure content of which is hereby included by reference.

LIST OF REFERENCE SIGNS

10 Optoelectronic semiconductor chip
100 Substrate

110 Buffer layer
120 Sacrificial layer
125 Oxidized sacrificial layer
130 Functional semiconductor layer sequence
140 First doped layer
150 Active layer
160 Second doped layer
170 Trench
171 Chip size
175 Channel
180 Carrier

The invention claimed is:

1. A method for producing an optoelectronic semiconductor chip having the following steps in the stated order:
    providing a substrate;
    depositing a buffer layer;
    depositing a sacrificial layer;
    depositing a functional semiconductor layer sequence, wherein the functional semiconductor layer sequence forms a light-emitting diode structure;
    laterally patterning the functional semiconductor layer sequence so that a grid-like system of trenches is formed, the trenches extend through the semiconductor layer sequence in the opposite direction to a growth direction from a top of the functional semiconductor layer sequence remote from the substrate, the trenches split the functional semiconductor layer sequence and the sacrificial layer and end in the buffer layer, which acts as an etch stop layer, while not patterning the substrate;
    oxidizing the sacrificial layer in a wet thermal oxidation process; and
    separating the functional semiconductor layer sequence from the substrate, wherein the substrate remains as a contiguous uninterrupted layer.

2. The method according to claim 1, wherein the substrate comprises GaAs,
    wherein the sacrificial layer comprises $Al_xGa_{1-x}As$,
    wherein $0.8 < x < 1$ and
    wherein $AlO_xH_y$ is formed during oxidation of the sacrificial layer.

3. The method according to claim 1, wherein the sacrificial layer comprises AlAs.

4. The method according to claim 1, wherein the sacrificial layer comprises $Al_xGa_{1-x}As$, and
    wherein $0.8 < x < 1$.

5. The method according to claim 1, wherein $AlO_xH_y$ is formed during oxidation of the sacrificial layer.

6. The method according to claim 1, wherein separating the functional semiconductor layer sequence from the substrate comprises removal by means of an etching solution of an oxide formed during oxidation of the sacrificial layer.

7. The method according to claim 1, wherein an etching solution is used which comprises hydrofluoric acid.

8. The method according to claim 1, wherein a shear force is exerted on the functional semiconductor layer sequence during separating the functional semiconductor layer sequence from the substrate.

9. The method according to claim 1, wherein the substrate is reused.

10. The method according to claim 1, wherein the following further step is carried out:
    bonding of the functional semiconductor layer sequence to a carrier.

11. The method according to claim 10, wherein the bonding of the functional semiconductor layer sequence to the carrier takes place prior to oxidation of the sacrificial layer.

12. The method according to claim 10, wherein the bonding of the functional semiconductor layer sequence to the carrier takes place after oxidation of the sacrificial layer.

13. The method according to claim 10, wherein the carrier comprises silicon or germanium.

14. The method according to claim 1, wherein the substrate comprises GaAs.

15. A method for producing an optoelectronic semiconductor chip having the following steps:
    providing a single substrate;
    depositing a buffer layer;
    depositing a sacrificial layer;
    depositing a functional semiconductor layer sequence;
    laterally patterning the functional semiconductor layer sequence so that a grid-like system of trenches is formed, the trenches extend through the semiconductor layer sequence in the opposite direction to a growth direction from a top of the functional semiconductor layer sequence remote from the substrate, the trenches split the functional semiconductor layer sequence and the sacrificial layer and end in the buffer layer, which acts as an etch stop layer, while not patterning the substrate;
    providing a carrier on the functional semiconductor layer sequence on a side remote from the substrate; and
    oxidizing the sacrificial layer in a wet thermal oxidation process,
    wherein the substrate comprises GaAs,
    wherein the sacrificial layer comprises $Al_xGa_{1-x}As$,
    wherein $0.8 < x < 1$
    wherein porous $AlO_xH_y$ is formed during oxidation of the sacrificial layer, and
    wherein during detachment of the functional semiconductor layer sequence from the single substrate, a shear force is exerted on the functional semiconductor layer sequence.

16. The method according to claim 15, wherein the steps of providing step, depositing the sacrificial layer, depositing the functional semiconductor layer sequence, laterally patterning and oxidizing are performed in that order.

17. A method for producing an optoelectronic semiconductor chip having the following steps:
    providing a GaAs substrate;
    depositing a sacrificial layer comprising $Al_xGa_{1-x}As$, wherein $0.8 < x < 1$;
    depositing a functional semiconductor layer sequence which is a light-emitting diode structure;
    laterally patterning the functional semiconductor layer sequence;
    oxidizing the sacrificial layer in a wet thermal oxidation process so that porous $AlO_xH_y$ is formed during oxidation of the sacrificial layer so that an oxidized sacrificial layer is yielded, the oxidized sacrificial layer is subsequently removed by means of an etching solution; and
    separating the functional semiconductor layer sequence from the substrate, wherein the substrate is reused.

* * * * *